(12) United States Patent
Forbes et al.

(10) Patent No.: US 6,741,104 B2
(45) Date of Patent: May 25, 2004

(54) DRAM SENSE AMPLIFIER FOR LOW VOLTAGES

(75) Inventors: Leonard Forbes, Corvallis, OR (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/320,421

(22) Filed: May 26, 1999

(65) Prior Publication Data

US 2001/0043089 A1 Nov. 22, 2001

(51) Int. Cl.[7] .......................... G01R 19/00; G11C 7/00; H03F 3/45
(52) U.S. Cl. .......................................... 327/55; 327/57
(58) Field of Search .............................. 327/51, 52, 55, 327/57; 365/149, 205, 230.03

(56) References Cited

U.S. PATENT DOCUMENTS

| | | | | |
|---|---|---|---|---|
| 5,047,816 A | * | 9/1991 | Cuevas | 357/23.14 |
| 5,162,681 A | * | 11/1992 | Lee | 327/53 |
| 5,442,209 A | * | 8/1995 | Chung | 257/270 |
| 5,652,166 A | * | 7/1997 | Sun et al. | 437/56 |
| 5,699,305 A | * | 12/1997 | Kawashima | 365/190 |
| 5,942,918 A | * | 8/1999 | Ang et al. | 327/57 |
| 5,953,259 A | * | 9/1999 | Yoon et al. | 365/189.04 |
| 5,982,690 A | * | 11/1999 | Austin | 365/205 |
| 6,069,828 A | * | 5/2000 | Kaneko et al. | 365/189.09 |
| 6,459,301 B2 | * | 10/2002 | Hidaka | 326/83 |

OTHER PUBLICATIONS

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), pp. 509–511, (Nov. 1996).

Frank, D.J., et al., "Monte Carlo Simulation of a 30 nm Dual–Gate MOSFET: How Short Can Si Go?", *IEDM*, pp. 553–556, (1992).

Frank, J., et al., "Monte Carlo Simulations of p– and n–Channel Dual–Gate Si MOSFET's at the Limits of Scaling", *IEEE Transactions on Electron Devices*, 40(11), p. 2103, (Nov. 1993).

Mizuno, T., et al., "High Performance Characteristics in Trench Dual–Gate MOSFET (TDMOS)", *IEEE Transactions on Electron Devices*, 38(9), pp. 2121–2127, (1991).

(List continued on next page.)

*Primary Examiner*—Terry D. Cunningham
*Assistant Examiner*—Quan Tra (57) ABSTRACT

Structures and methods for improving sense amplifier operation are provided. A first embodiment includes a sense amplifier having a pair of cross-coupled inverters. Each inverter includes a transistor of a first conductivity type and a pair of transistors of a second conductivity type which are coupled at a drain region and are coupled at a source region. The drain region for the pair of transistors is coupled to a drain region of the transistor of the first conductivity type. A pair of input transmission lines are included where each one of the pair of input transmission lines is coupled to a gate of a first one of the pair of transistors in each inverter. A pair of output transmission lines is included where each one of the pair of output transmission lines is coupled to the drain region of the pair of transistors and the drain region of the transistor of the first conductivity type in each inverter.

High performance, wide bandwidth or very fast CMOS amplifiers are possible using the new circuit topology of the present invention. The new modified sense amplifier for low voltage DRAMs is as much as 100 times faster than a conventional voltage sense amplifier when low power supply voltages, e.g. Vdd less than 1.0 Volts, are utilized. In the novel sense amplifier, the bit line capacitance is separated from the output nodes of the sense amplifier.

32 Claims, 7 Drawing Sheets

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits, 27(4)*, pp. 618–625, (Apr. 1992).

Kuge, S., et al., "SOI–DRAM Circuit Technologies for Low Power High Speed Multigiga Scale Memories", *IEEE Journal of Solid–State Circuits, 31(4)*, pp. 586–591, (Apr. 1996).

Parke, S.A., "Optimization of DRAM Sense Amplifiers for the Gigabit Era", *IEEE, Proceedings of the 40th Midwest Symposium on Circuits and Systems*, Sacramento, CA, pp. 209–212, (1997).

Suma, K., et al., "An SOI–DRAM with Wide Operating Voltage Range by CMOS/SIMOX Technology", *IEEE Journal of Solid–State Circuits, 29(11)*, pp. 1323–1329, (nov. 1994).

\* cited by examiner

DRAM SENSE AMPLIFIER FOR LOW VOLTAGES

FIELD OF THE INVENTION

The present invention relates generally to electronic circuits. More particularly, it pertains to sense amplifiers operating with low voltage supplies.

BACKGROUND OF THE INVENTION

Figure 1A:
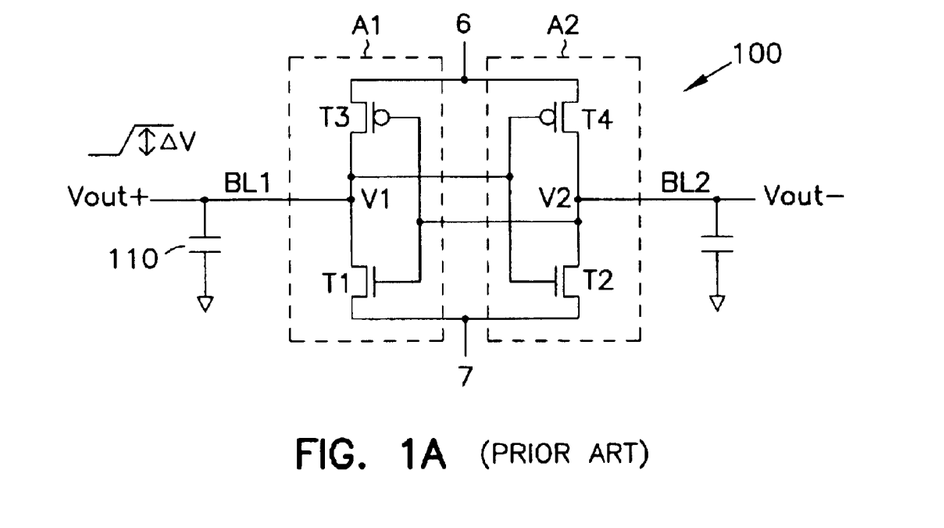
FIG. 1A is a schematic diagram illustrating an embodiment of a convention sense amplifier.
Figure 1B:
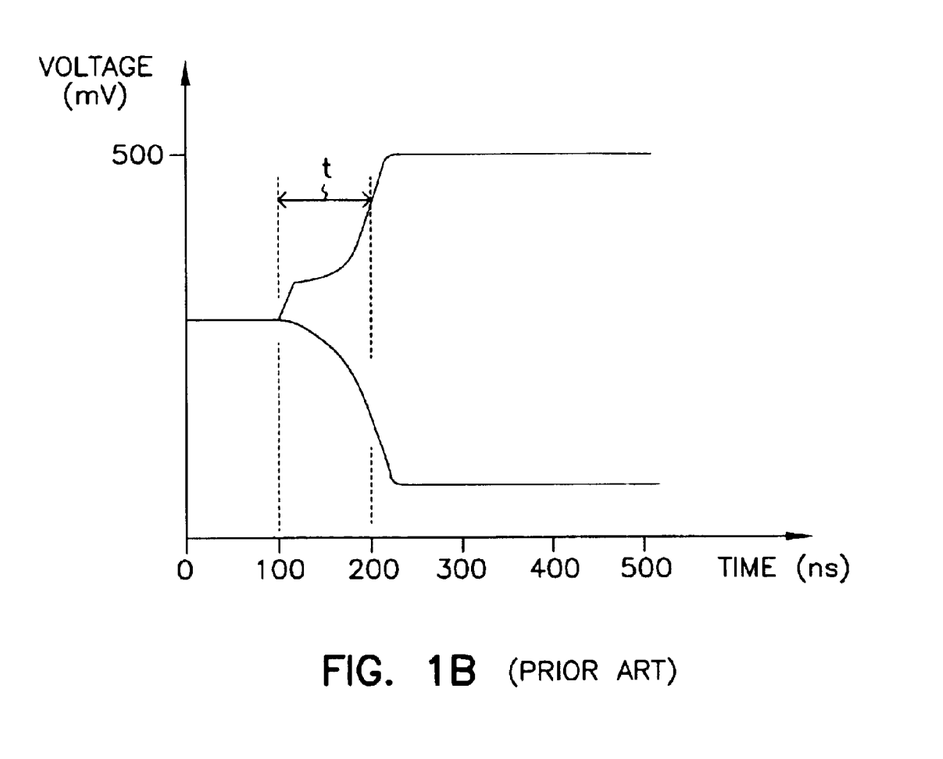
FIG. 1B is a graphical representation of the output voltage versus time (V-t) curve for the conventional sense amplifier shown in FIG. 1A.

Lower and lower power supply voltages are being employed on DRAM memory chips, which places more stringent requirements on the design parameters of sense amplifiers. It is difficult to get a conventional sense amplifier to have adequate response characteristics at these lower power supply voltages. FIG. 1A is a schematic diagram illustrating a conventional cross-coupled sense amplifier. FIG. 1B is a graph illustrating the very slow response of the conventional cross-coupled sense amplifier at a power supply voltage of 0.5V. As shown in FIG. 1B, it can take up to nearly 100 nanoseconds (t=100 ns) to achieve a significant sense signal and output voltage from the sense amplifier. This is far too long to be of any use in a conventional memory system.

Recently, synchronous body bias has been utilized in the sense amplifier designs in SOI technology with 0.9V power supply voltages on DRAMs. Examples of this are provided by: S. Kuge et al, "SOI-DRAM circuit technologies for low power high speed multigigascale memories," IEEE J. Solid-State Circuits, Vol. 31, pp. 586–591, April 1996; and K. Suma et al., "An SOI-DRAM with wide operating voltage range by CMOS/SIMOX technology," IEEE J. Solid-State Circuits, Vol 29, pp. 1323–1329, November 1994. In the synchronous body bias arrangement, the body of the n-channel metal oxide semiconductor (NMOS) transistors are separately forward biased when the sense amplifier is activated to lower the magnitudes of the threshold voltages (Vt). This was found to be necessary to achieve reasonable response time from the sense amplifier at low power supply voltages. Unfortunately, the synchronous body bias arrangement requires extra clock or phase voltages, extra control lines and extra body contacts for the devices. These requirements quickly consume valuable surface area on the semiconductor chip.

Another technique to achieve improved performance from sense amplifiers includes the use of current sense amplifiers in the place of voltage sense amplifiers. Still another technique includes using gate-body connected transistors in the construction of the sense amplifier. Current sense amplifiers achieve a significant improvement in response by virtue of the fact that the voltage swing on the bit lines is very small, and by virtue of the fact that the large bit line capacitances are not connected to the output nodes. However, a current sense amplifier is not compatible with low power supply voltages. This is because the current sense amplifier is basically three devices are stacked up one atop another.

In its basic form, the three devices of a current differential amplifier include a current sink device, designed to provide common mode feedback and rejection, a pair of transistors for amplification, and a pair of load devices. Operation criteria demand that some significant overdrive, e.g., the excess in a transistor's gate to source potential (VGS) over the transistor's threshold voltage (VT), or (VGS-VT), is required in order to provide reasonable gain (G).

Another prior art method is basically to use a traditional sense amplifier and after firing the word line, dumping the charge onto the digitlines, then turn off the isolation transistors, perform the sensing process, and then once again turn the isolation transistors back on. This is one approach to attain high-speed sensing by separating the bitline capacitances at the expense of somewhat delaying your write back. However, there is still a delay between turning off the isolation transistors and firing the sense amplifier. And, still even better low-voltage designs are needed.

For the reasons stated above, and for other reasons stated below which will become apparent to those skilled in the art upon reading and understanding the present specification, it is desirable to develop sense amplifiers with improved response characteristics which can be fabricated according to a CMOS process and which can operate at power supply voltages of 1.0 V and below.

SUMMARY OF THE INVENTION

The above-mentioned problems with sense amplifier configuration and operation as well as other problems are addressed by the present invention and will be understood by reading and studying the following specification. Structures and methods are provided which accord exemplary performance.

The new modified sense amplifier for low-voltage DRAMs is as much as 100 times faster than a conventional voltage sense amplifier when low power supply voltages, e.g. Vdd less than 1.0 Volts, are utilized. In the novel sense amplifier, the bit line capacitances are separated from the output nodes of the sense amplifier. High performance, wide bandwidth or very fast CMOS amplifiers are possible using the new circuit topology of the present invention.

A first embodiment includes a sense amplifier having a pair of cross-coupled invertors. Each inverter includes a transistor of a first conductivity type and a pair of transistors of a second conductivity type which are coupled at a drain region and are coupled at a source region. The drain region for the pair of transistors is coupled to a drain region of the transistor of the first conductivity type. A pair of input transmission lines are included where each one of the pair of input transmission lines is coupled to a gate of a first one of the pair of transistors in each inverter. A pair of output transmission lines are included where each one of the pair of output transmission lines is coupled to the drain region of the pair of transistors and the drain region of the transistor of the first conductivity type in each invertor.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A shows the schematic illustration of a conventional sense amplifier 100. The conventional sense amplifier 100 includes a pair of cross-coupled inverters, A1 and A2. Each inverter A1 and A2 includes a first transistor of a first conductivity type, T1 and T2, and includes a second transistor of a second conductivity type, T3 and T4. The transistors of the first and second conductivity type are coupled to one another at a drain region for each inverter, A1 and A2. A power supply voltage is coupled to node 6, and a ground potential is coupled to node 7 of the conventional sense amplifier 100. A pair of bit lines, BL1 and BL2, independently couple to the drain region for each inverter, A1 and A2. In the conventional sense amplifier 100 these drain regions additionally serve as the output nodes, V1 and V2, for the conventional sense amplifier 100. Thus, in the conventional sense amplifier 100 of FIG. 1A the bit line, BL1 and BL2, capacitances are coupled to the output nodes, V1 and V2.

FIG. 1B is a graphical representation of an output voltage versus time (V-t) curve for the conventional sense amplifier shown in FIG. 1A. FIG. 1B illustrates the responsiveness of the conventional sense amplifier operated with a power supply of 0.5 Volts and where the transistors in the sense amplifier are constructed to have a threshold voltage V(t) of approximately 0.3 Volts. As shown in FIG. 1B, the conventional sense amplifier has a relatively slow response time of 100 nanoseconds (t=100 ns) when operating at this low power supply voltage (e.g. Vdd=0.5 Volts).

Figure 1C:
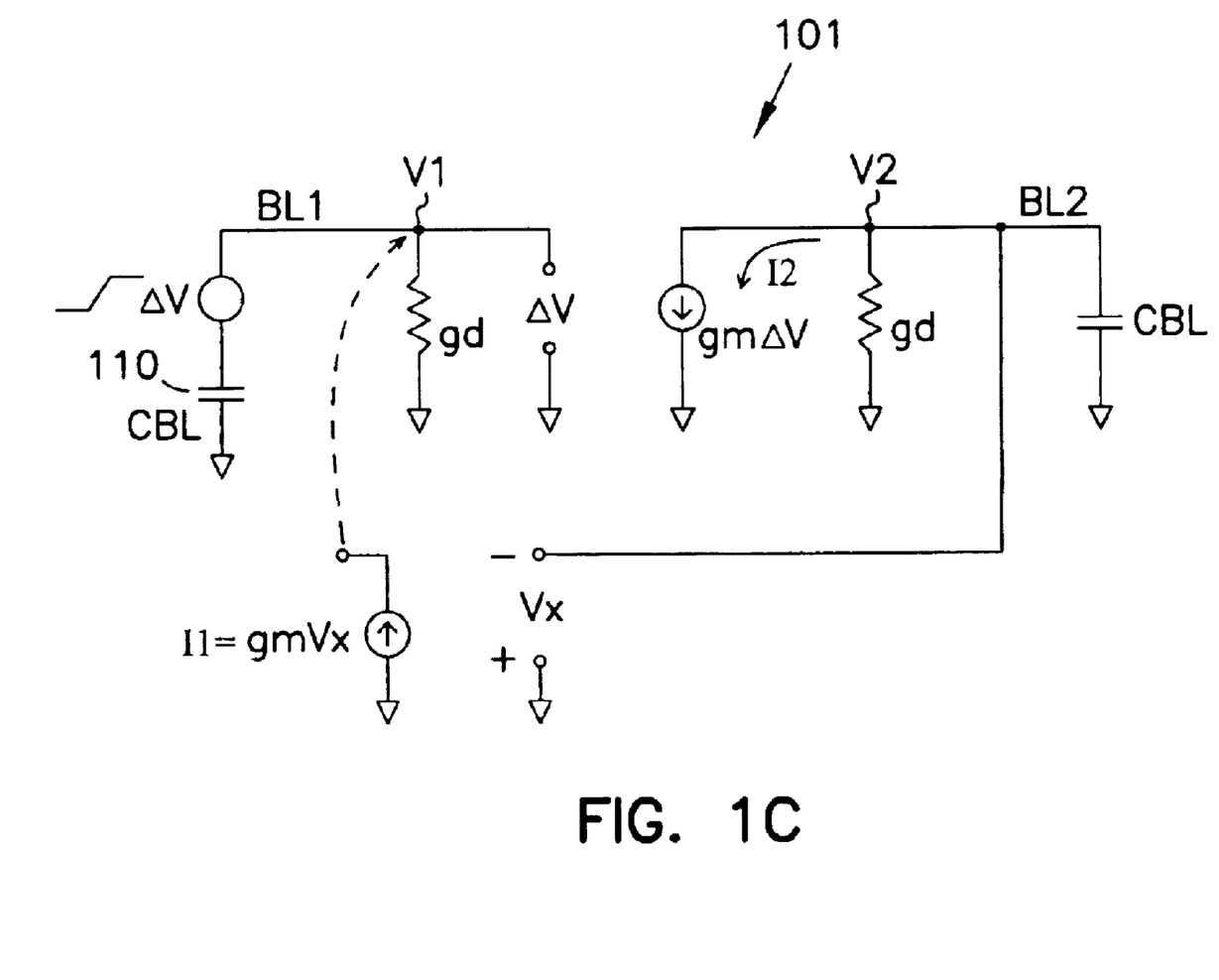
FIG. 1C is a schematic diagram of a small signal equivalent circuit model for FIG. 1A.

FIG. 1C is a schematic diagram of a small signal equivalent circuit model 101 of the conventional sense amplifier in FIG. 1A. Again, the threshold voltage (Vt) magnitudes are fixed at about 0.3–0.35V for both the n-channel (NMOS) and p-channel (PMOS) transistors which make up the inverters of the cross-coupled inverters A1 and A2 of the conventional sense amplifier 100. During most of the switching transients the transistors are operating in the sub-threshold or threshold region since the power supple voltage is only Vdd=0.5V. The sense amplifier output nodes and bit lines, BL1 and BL2, are initially balanced at Vdd/2 as is common in conventional voltage sense amplifiers. A disturbance is applied by discharging a memory cell 110 onto one of the bit lines, e.g. BL1. In this case a signal of 50 milliVolts (mV) is applied to one side of the sense amplifier. Due to the positive feedback in the cross-coupled configuration of inverters, the signal regenerates and a characteristic shape is obtained for the complementary output voltages which diverge as shown in FIG. 1B.

An analysis of the operation of the conventional sense amplifier 100 in FIG. 1A is provided in connection with reference to the small signal equivalent circuit model 101 of FIG. 1C. The analysis shows that the magnitude of a voltage, VX, at node V2 in the conventional sense amplifier 100 increases linearly with time and that the magnitude of a voltage, VY, at node V1 of the conventional sense amplifier 100 increases quadratically with time. Here VY is equivalent to Vout on the conventional current sense amplifier 100.

As shown in FIG. 1C, a voltage signal, $\Delta V$, is placed onto the first bit line BL1 from a discharged memory cell on to bit line capacitance 110. For simplicity, and by way of illustration, the transistors have been assumed to be described by similar parameters and in particular similar transconductance parameters in the device models. In practice, of course, the device sizes are ratioed and the PMOS transistors fabricated with a larger width to length (W/L) ratio. All transistors in the circuit, e.g., n-type and p-type, then have the same transconductance (where gm=gmn+gnp, and gmn=gmp) and drain conductance (where gd=gdn+gdp, and gdn=gdp). In operation, due to the voltage signal, $\Delta V$, being coupled to node V1, the potential at node V1 increases. As node V1 of the first inverter raises to a high potential the cross-coupled nature of the inverters, A1 and A2, places the high potential on the gate of the p-channel transistor T4. Transistor T4 turns "off" and a voltage signal, VX, seen at node V2 on FIG. 1, goes toward ground. At this point, a current signal, I2, is flowing at node V2 into a current source, which is transistor T2, and pulls bit line BL2 and node V2 toward ground. The current signal I2 can be expressed as I2=gm×$\Delta V$. I2 can also be expressed as I2=$\Delta Q$/t=CBL×VX/t. Substituting equivalent expression for I2 produces gm×$\Delta V$=CBL×(VX)/t. Solving for VX yields VX=gm×($\Delta V$)×t/CBL.

The cross-coupled nature of the inverters, A1 and A2, provides feedback to the gates of transistors T1 and T3 in the first inverter A1. The feedback includes the voltage potential, VX, from node V2. This feedback turns "on" transistor T3. Turning "on" transistor T3 increases the conduction through transistor T3. At this point a voltage potential, VY, is present at node V1 and a current signal, I1, is exiting node V1 to bitline BL1. Here, the current signal I1 is expressed as I1=gm×VX. Similar to the above analysis, the current signal, I1, can also be expressed as I1=ΔQ/Δt= CBL×(VY)/t. Substituting equivalent expressions for I1 produces gm×VX=CBL×(VY)/t.

Substituting the value of VX from above, i.e. VX=gm× ΔV×t/CBL, yields gm×(gm×ΔV×t)/CBL=CBL×(VY)/t.

Solving for VY where VY is equivalent to Vout yields, $$VOUT^+ = VY = (gm/CBL)^2 \times \Delta V \times t^2 \qquad (1)$$

As stated above, gm is the effective transconductance of the n-channel and p-channel transistors or the sum of the individual transconductances, CBL is the bitline capacitance, ΔV is the initial signal injected into the conventional sense amplifier from the bit line, BL1, and t is the signal rise time.

As is illustrated in detail in FIG. 1C, the output voltage increases relatively slowly as the square of time. The problem with a conventional voltage sense amplifier is that the bit line capacitance CBL is so large, e.g., can be up to 200 femto Farads (fF) in magnitude, that the output sense signal, Vout, is delayed. That is, the transconductance of transistors in the conventional sense amplifier, when operated with low voltages, is relatively small. This results in an insufficient response time for the conventional sense amplifier 100.

In one example, the full transconductance of both full-size transistors constituting each inverter, A1 and A2, is gm=20 microsiemens (µS). The bit line, BL1 and BL2, capacitances are approximated at 200 fF. Solving for t from the equation (1) gives t=CBL/gm √V/out/ΔV. That is, t≈10 ns √Vout/ΔV.

Figure 2A:
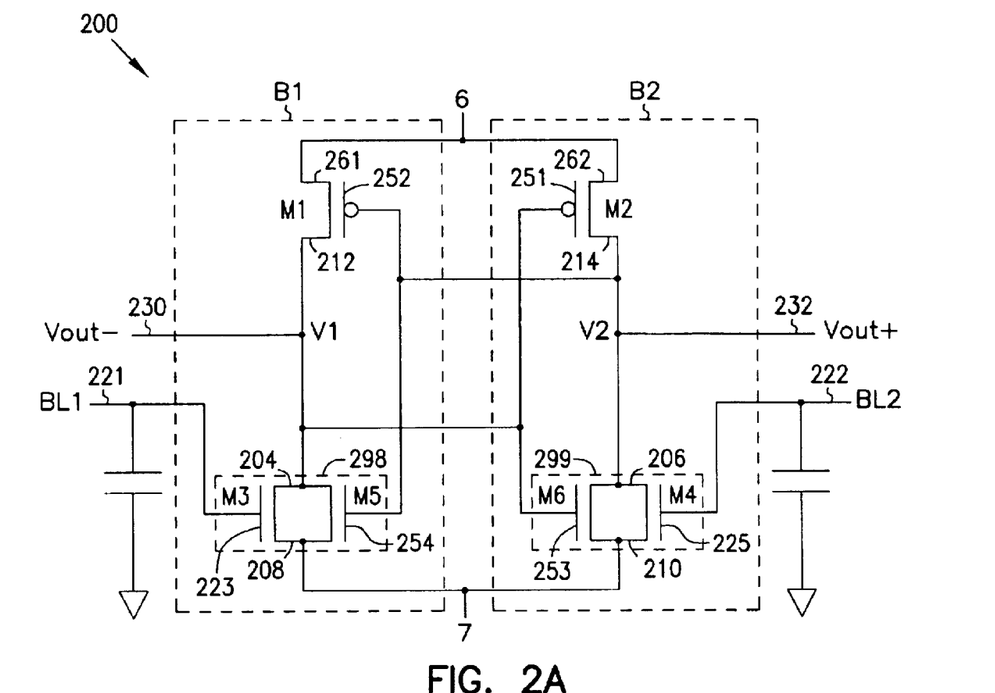
FIG. 2A is a schematic illustration of a novel sense amplifier according to the teachings of the present invention.

FIG. 2A is a schematic diagram illustrating a novel sense amplifier circuit 200, latch circuit 200, or amplifier circuit 200 according to the teachings of the present invention. The novel sense amplifier circuit 200 includes a voltage sense amplifier where the bit lines, BL1 and BL2 are removed from the output nodes V1 and V2. This results in much faster response time. And in the novel sense amplifier circuit 200 only two devices, the minimal number, are stacked up. FIG. 2A shows only the basic circuit without the extra transistors as normally required for enable and balancing functions.

As shown in FIG. 2A, the sense amplifier 200 includes a pair of cross-coupled inverters, B1 and B2, or cross-coupled amplifiers, B1 and B2. Each inverter, B1 and B2, includes a first transistor of a first conductivity type, M1 and M2 respectively. In one embodiment, the transistor of a first conductivity type includes a p-channel metal oxide semiconductor (PMOS) transistor. As shown in FIG. 2A, the NMOS transistors T1 and T2 in the conventional sense amplifier 100 of FIG. 1A are each divided into two separate transistors. Thus, each inverter, B1 and B2, includes a second transistor, M3 and M4 respectively, and includes a third transistor, M5 and M6 respectively, each of a second conductivity type.

The second transistor, M3 and M4, and third transistor, M5 and M6, in each inverter, B1 and B2, are coupled at a drain region, 204 and 206 respectively. The second transistor, M3 and M4, and third transistor, M5 and M6, in each inverter, B1 and B2, are also coupled at a source region, 208 and 210 respectively. In this manner, the second transistor, M3 and M4, and the third transistor, M5 and M6, in each inverter, B1 and B2, form a pair of transistors, M3, M5, and M4, M6 respectively, of a second conductivity type in each inverter, B1 and B2. In one embodiment, the pair of transistors, M3, M5, and M4, M6 respectively, includes a pair of n-channel metal oxide semiconductor (NMOS) transistors. Further, the drain region, 204 and 206, in each pair of transistors, M3, M5, and M4, M6, is coupled to a drain region, 212 and 214 respectively, of the transistor of the first conductivity type, M1 and M2.

A pair of input transmission lines, bit lines, or digitlines, 221 and 222, couple to the sense amplifier 200. Each one of the pair of input transmission lines, 221 and 222, is coupled to a gate of one of the transistors in the pair of transistors, M3, M5, and M4, M6 inverter. In the embodiment shown in FIG. 2A, each one of the pair of input transmission lines, 221 and 222, is coupled to a gate, 223 and 225 respectively, of a first one, or first transistor, M3 and M4, in the pair of transistors, M3, M5, and M4, M6, in each inverter, B1 and B2. As shown in FIG. 2A, the bit line, 221 and 222, capacitances are removed from the pair of output transmission lines.

The first inverter B1 and the second inverter B2 are cross-coupled. As shown in FIG. 2A, the drain region 204 of the pair of transistors M3, M5 and the drain region 212 of the transistor of the first conductivity type M1 in inverter B1 is further coupled to a gate 251 of the transistor of a first conductivity type M2 and to a gate 253 of a second one, or second transistor, M6, of the pair of transistors, M4, M6, in the other inverter, B2. Similarly, the drain region 206 of the pair of transistors M4, M6 and the drain region 214 of the transistor of the first conductivity type, M2, in inverter B2 is further coupled to a gate 252 of the transistor of a first conductivity type, M1, and to a gate 254 of a second one, or second transistor, M5, of the pair of transistors, M3, M5, in the other inverter, B2.

A pair of output transmission lines, 230 and 232, are coupled to the sense amplifier 200. Each one of the pair of output transmission lines is coupled to the drain region, 204 and 206, of the pair of transistors, M3, M5, and M4, M6 and the drain region, 212 and 214 of the transistor of the first conductivity type, M1 and M2, in each inverter, B1 and B2. In the novel sense amplifier 200 shown in FIG. 2A a source region, 261 and 262, for the first transistor, or transistor of first conductivity type, M1 and M2 respectively in each inverter, B1 and B2 is coupled to a power supply voltage at node 6. In one embodiment, the power supply voltage at node 6 is less than 1.0 Volts. The novel sense amplifier 200 also has a ground node, RNL or node 7. In one embodiment, the RNL or node 7 is coupled to ground. In an alternative embodiment, the RNL or node 7 is coupled is coupled to a different voltage potential, e.g. a voltage potential lower than ground.

In an alternative embodiment, the pair of transistors, M3, M5, and M4, M6, in each inverter, B1 and B2, comprise a dual-gated metal oxide semiconductor field effect transistor (MOSFET), 298 and 299, respectively, in each inverter, B1 and B2. In this embodiment, each one of the pair of input transmission lines is coupled to a first gate of the dual-gated MOSFET in each inverter, B1 and B2. In this embodiment, the transistor of a first conductivity type includes a p-channel metal oxide semiconductor (PMOS) transistor, and the dual-gated MOSFET of a second conductivity type is divided into two separate n-channel metal oxide semiconductor (NMOS) transistors, each driven by one of the dual gates. In this embodiment, the drain regions, 204 and 212, for one of the cross-coupled inverters, B1, is further coupled to a gate of the transistor of the first conductivity type, M2, and to a second gate of the dual-gated MOSFET in the other one of the cross-coupled inverters, B1 and B2. Similarly, the drain regions, 206 and 214, for inverter, B2, is coupled to a gate of the transistor of the first conductivity type, M1, and to a second gate of the dual-gated MOSFET in the other one of the cross-coupled inverters, B1 and B2.

Figure 2B:
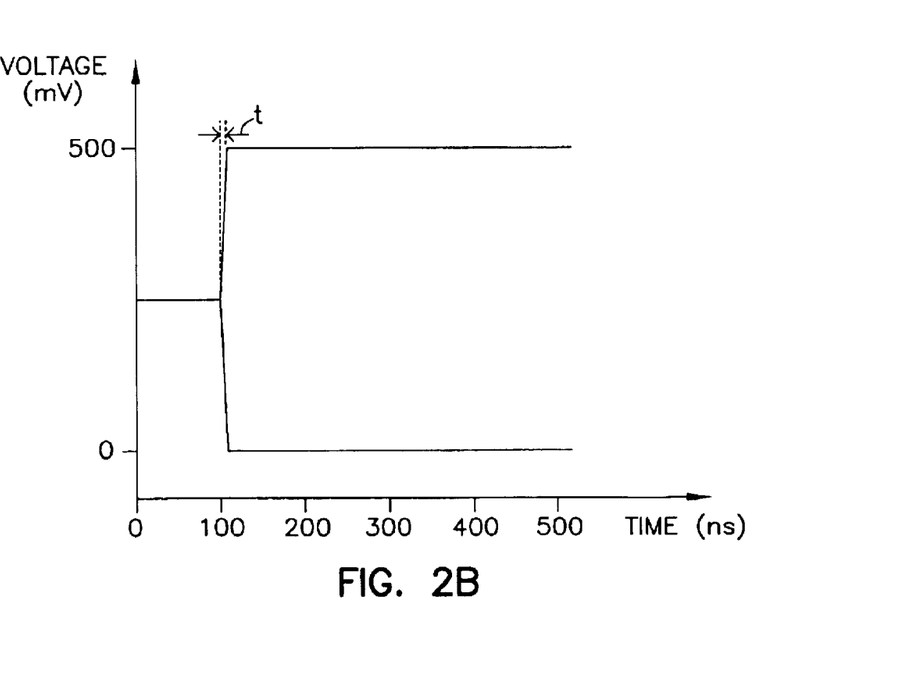
FIG. 2B is an V-t graph illustrating one embodiment of the operation of the novel sense amplifier circuit shown in FIG. 2A.

FIG. 2B is a graphical representation of an output voltage versus time (V-t) curve for the novel sense amplifier shown in FIG. 2A. Again, in the modified new sense amplifier configuration of FIG. 2A the bit line capacitance is not connected to the output nodes, V1 and V2. In FIG. 2A, each n-channel transistor, T1 and T2, of FIG. 1A is divided in half into two separate transistors, and each bit line, BL1 and BL2, is connected separately to one of these additional transistors. FIG. 2B illustrates the responsiveness of the novel sense amplifier operated with a power supply of 0.5 Volts and where the transistors in the sense amplifier are constructed to have a threshold voltage of approximately 0.3 Volts. As shown in FIG. 2B, the novel sense amplifier of the present invention has much faster response time of less than 10 nanoseconds (t=10 ns).

Figure 2C:
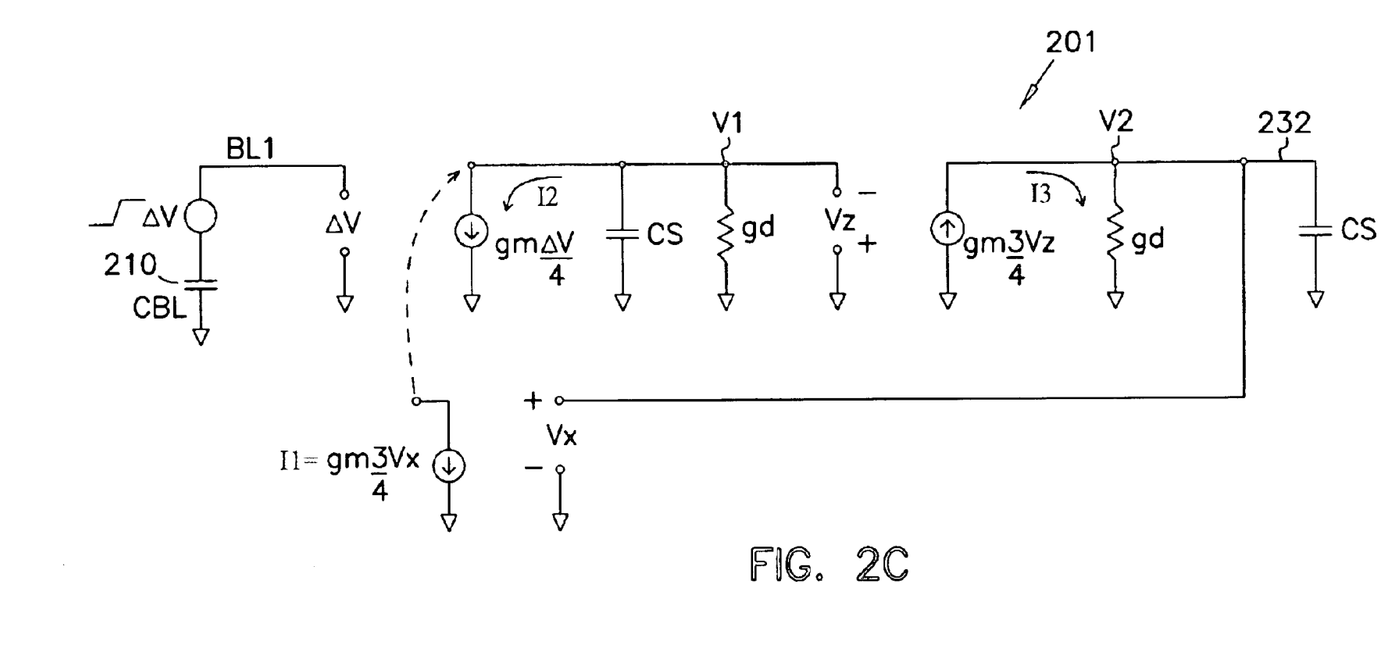
FIG. 2C is a schematic diagram of a small signal equivalent circuit model for FIG. 2A.

FIG. 2C is a schematic diagram of a small signal equivalent circuit model of the novel sense amplifier 200, shown in FIG. 2A. Again, the threshold voltage (Vt) magnitudes are fixed at about 0.3–0.35V for both the n-channel (NMOS) and p-channel (PMOS) transistors which make up the inverters of the cross-coupled inverters, B1 and B2, of the novel sense amplifier 200. During most of the switching transients the transistors are operating in the sub-threshold or threshold region since the power supple voltage is only Vdd=0.5V. The sense amplifier output nodes and bit lines are initially balanced at Vdd/2 as is common in conventional voltage sense amplifiers. A disturbance is applied by discharging a memory cell onto the capacitance 210 of the bit lines, e.g. BL1. In this case a signal of 50 millivolts (mV) is applied to one side of the sense amplifier. Due to the positive feedback in this cross-coupled configuration of inverters, the signal regenerates and a characteristic shape is obtained for the complementary output voltages which diverge as shown in FIG. 2B.

An analysis of the operation of the novel sense amplifier 200 in FIG. 2A is provided in connection with reference to the small signal equivalent circuit model 201 of FIG. 2C. Here VY is equivalent to Vout on the novel current sense amplifier 200. As shown in FIG. 2C, a voltage signal, $\Delta V$, placed onto the capacitance 210 of the first bit line BL1 from a discharged memory cell drives the gate 223 of transistor M3 on the left hand side, or first side, of the novel sense amplifier 200. Driving the gate of this NMOS transistor increases the conduction flowing through transistor M3. This results in a decreasing voltage potential, VZ, at node V1.

At this point, a current signal, I2, associated with the voltage potential, VZ, is flowing at node V1. Since the voltage signal, $\Delta V$, only drives the gate 223 of transistor M3, the transconductance, gm, at node V1 is only one-fourth the value seen at node V1 in FIG. 1A. I2 can be expressed as $I2=gm \times \Delta V/4$. I2 can also be expressed as $I2=\Delta Q/t=CS \times VZ/t$, where CS is the stray capacitance value. Substituting equivalent expressions for I2 produces $gm \times \Delta V/4=CS \times (VZ)/t$. Solving for VZ yields $VZ=(\frac{1}{4}) \times (gm/CS) \times (\Delta V) \times t$.

The voltage potential, VZ, at node V1 is coupled to a gate 251 of the PMOS transistor, M2, and to a gate 253 of NMOS transistor M6. The decreasing voltage potential, VZ, at node V1 places a lower potential on the gate of PMOS transistor, M2. As a result, transistor M2 turns "on" and transistor M6 turns "off." Here, the NMOS transistor, T2, on the right hand side, or second side, of the conventional sense amplifier 100 of FIG. 1A has been replace by two NMOS transistors, M4 and M6 in the novel sense amplifier 200 of FIG. 2A. Since VZ only drives the gates, 251 and 253, of M2 and M6, the transconductance, gm, at node V2 is three-fourths the value seen at node V2 in FIG. 1A, e.g. a slightly lower transconductance.

At this point, a voltage potential, VX, is present at node V2 and a current signal, I3, is flowing at node V2. I3 can be expressed as $I3=(\frac{3}{4}) \times gm \times VZ$. The current signal I3 can also be expressed as $I3=\Delta Q/t=CS \times VX/t$, where CS is the stray capacitance value. Substituting equivalent expressions for I3 produces $(\frac{3}{4}) \times gm \times VZ=CS(VX)/t$. Substituting the value of VZ from above, i.e. $VZ=(\frac{1}{4}) \times (gm/CS) \times (\Delta V) \times t$, into the equation yields $(\frac{3}{4}) \times gm \times (\frac{1}{4}) \times (gm/CS) \times (\Delta V) \times t=CS \times (VX)/t$. Solving for VX then yields $VX=(\frac{3}{16}) \times (gm/CS)^2 \times (\Delta V) \times t^2$.

The cross-coupled nature of the inverters, B1 and B2, provides a feedback to the gates of transistors M1 and M5 in the first inverter B1. The feedback includes the voltage potential, VX, from node V2. This feedback turns "off" transistor M1 and turns "on" transistor M5. Turning "off" transistor M1 decreases the conduction through transistor M1. Turning "on" transistor M5 increases the conduction through transistor M5. As explained above, the NMOS transistor, T1, on the left hand side, or second side, of the conventional sense amplifier 100 of FIG. 1A has been replace by two NMOS transistors, M3 and M5 in the novel sense amplifier 200 of FIG. 2A. Since VX only drives the gates, 252 and 254, of M1 and M5, the transconductance, gm, at node V1 is three-fourths the value seen at node V1 in FIG. 1A, i.e., a slightly lower transconductance.

At this point, a voltage potential, VY, is present at node V1. The decreased conduction through transistor M1, and increased conduction through transistor M5, provides a current signal, I1, flowing at node V1. Here again, similar to the above analysis $I1=(\frac{3}{4}) \times gm \times VX$. The current signal I1 can also be expressed as $I1=\Delta Q/t=CS \times (VY)/t$. Substituting equivalent expressions for I1 produces $(\frac{3}{4}) \times gm \times VX=CS \times (VY)/t$. Substituting into this equation the value of VX from above, i.e. $VX=(\frac{3}{16}) \times (gm/CS)^2 \times (\Delta V) \times t^2$, yields $(\frac{3}{4}) \times gm \times (\frac{3}{16}) \times (gm/CS)^2 \times (\Delta V) \times t^2 = CS \times (VY)/t$.

Solving for VY where VY is equivalent to Vout at node V1, yields $$VOUT = VY = (\tfrac{9}{64}) \times (gm/CS)^3 \times \Delta V \times t^3 \quad (2)$$

Again, gm is the effective transconductance of the n-channel and p-channel transistors or the sum of the individual transconductances. CS represents the stray capacitances connected to the output nodes, the input capacitances of subsequent amplifiers connected to nodes V1 and V2. As shown in equation (2), the output has a slightly different power law dependence on time, now cubic. The novel sense amplifier has a slightly lower transconductance, gm, of the transistors in the cross-coupled inverters, B1 and B2, (e.g. cross-coupled latch, or latch circuit) which is approximately three-fourths of the original value of that in FIG. 1A. However, a much faster response time is provided for obtaining a full output sense voltage since the output nodes only need to drive the small stray capacitances of the nodes, V1 and V2, and the input capacitances of the subsequent amplifiers. There is also no delay associated with turning off the isolation transistors. According to the present invention, you can fire the sense amplifier as soon as the charge is placed on the digit lines, or bit lines. The net result is that the response might be as much as 100 times faster since CS might typically be more like a few femto Farads (fF), e.g. 2.5 fF, rather than 200 fF or so for the bit line capacitances as in the conventional sense amplifier of FIG. 1A.

In one example, the full transconductance of both full-size transistors constituting each inverter, B1 and B2, is gm=20 microsiemens ($\mu S$). The bit line, BL1 and BL2, capacitances are approximated at 200 fF. The stray capacitances, CS, are taken as 2.5 femto Farads (fF). Solving for t from the equation (2) gives t=CS/gm $\sqrt[3]{64/9}\overline{\text{Vout}}/\Delta V$. That is, t≈0.1 ns $\sqrt[3]{64/9}\ \overline{\text{Vout}}/\Delta V$.

Figure 3:
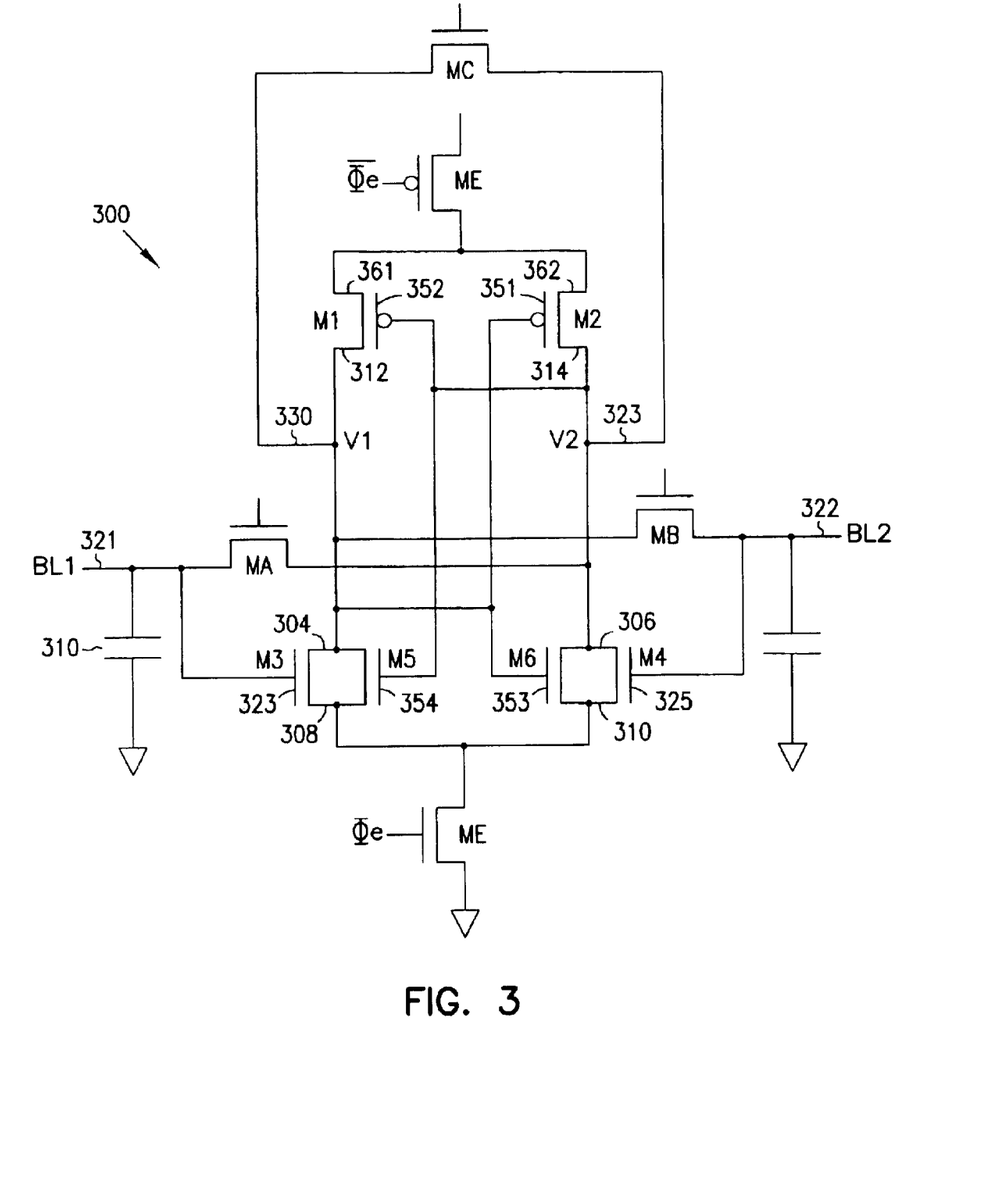
FIG. 3 illustrates one possible configuration for the inclusion of other transistors in the novel sense amplifier of FIG. 2A as in normally done to achieve enable functions, and precharge and balance of the sense amplifier.

FIG. 3 shows the sense amp with extra transistors for enable and balance. FIG. 3 illustrates one possible configuration for the inclusion of other transistors as in normally done to achieve enable functions, and precharge and balance of the sense amplifier. Transistors ME are used to select and enable the sense amplifier. Transistors MA, MB, and MC can be used to balance the amplifier and bit lines after the bit lines are precharged by other transistors at for instance the ends of the bit lines, not shown here. After balance is achieved, these transistors are turned off and the signal sensed by discharging a storage capacitance, Cstorage, from a memory cell coupled onto the capacitance 310 of one of the bit lines. At the completion of the sense cycle the original data can be written back into the cell by activating transistors MA and MB.

Figure 4:
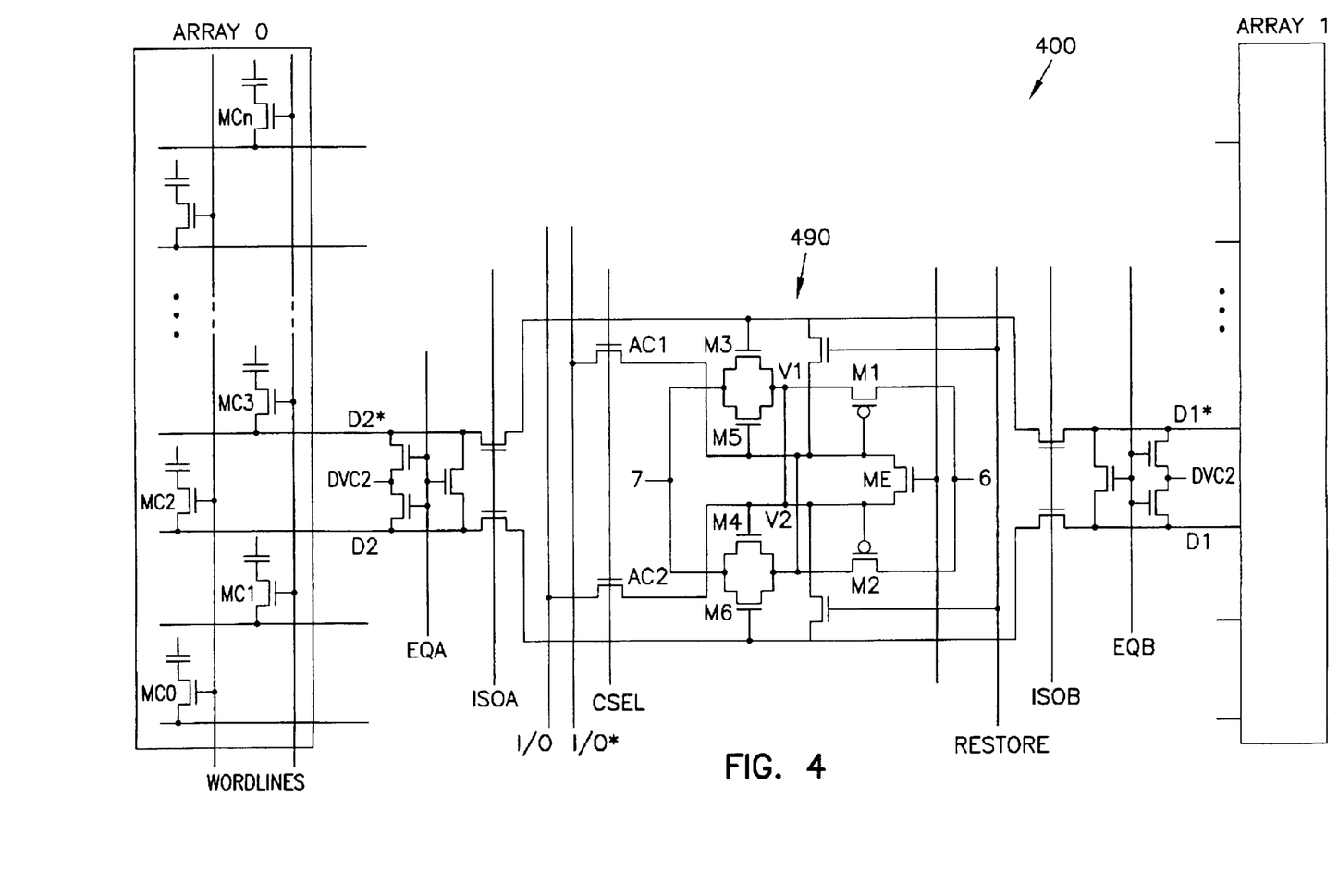
FIG. 4 illustrates a memory circuit formed according to the teachings of the present invention.

FIG. 4 illustrates a memory circuit 400 formed according to the teachings of the present invention. The memory circuit 400 includes a number of memory cell arrays, shown in FIG. 4 as ARRAY 0 and ARRAY 1. Each of the number of memory cell arrays, ARRAY 0, ARRAY 1, etc., a number of memory cells, MC1, MC2, . . . , MCn, arranged in row and columns. The number of memory cells, MC1, MC2, . . . , MCn, are coupled to wordlines. The memory circuit 400 includes at least one sense amplifier 490 as described and presented in detail above in connection with FIG. 2A. The at least one sense amplifier 490 has a power supply node, ACT or node 6. In one embodiment, the power supply node is coupled to a power supply voltage of less than 1.0 Volts. The at least one sense amplifier 490 also has a ground node, RNL or node 7. In one embodiment, the RNL or node 7 is coupled to ground. In an alternative embodiment, the RNL or node 7 is coupled is coupled to a different voltage potential, e.g. a voltage potential lower than ground.

The memory circuit includes a number of complementary pairs of bit lines or digitlines, shown in FIG. 4 as D1, D1* and D2, D2*. The complementary pairs of bit lines, D1, D1* and D2, D2*, couple the at least one sense amplifier 490 to the number of memory cells, MC1, MC2, . . . , MCn, contained in the number of memory cell arrays, ARRAY 0, ARRAY 1, etc. The complementary pairs of bit lines, D1, D1* and D2, D2*, also couple to the at least one sense amplifier 490 in the manner presented and described in detail in connection with FIG. 2A.

The memory circuit 400 includes a number of equilibration transistors, EQA, EQB, etc, and at least one enable transistor, ME, which couple to the complementary pairs of bit lines, D1, D1* and D2, D2*, and to the at least one sense amplifier 490 as shown in FIG. 4. The memory circuit 400 includes a pair of output transmission lines, or input/output lines, shown in FIG. 4 as I/O and I/O*. The output transmission lines, I/O and I/O*, are operatively coupled to output nodes, V1 and V2, on the at least one sense amplifier 490 through access transistors, AC1 and AC2 respectively. A column select line, shown in FIG. 4 as CSEL, couples to the gates of the access transistors, AC1 and AC2.

The memory circuit 400 includes a number of isolation transistors, shown in FIG. 4 as ISOA and ISOB. The number of isolation transistors, ISOA and ISOB, also couple to the complementary pairs of bit lines, D1, D1* and D2, D2*, and to the at least one sense amplifier 490 and can isolate the at least one sense amplifier 490 from the complementary pairs of bit lines, D1, D1* and D2, D2*. In one embodiment, the memory circuit 400 includes a folded bit line, or folded digitline memory circuit 400 as shown in FIG. 4. In an alternative embodiment, the memory circuit 400 includes other digitline configuration schemes as will be understood by one of ordinary skill in the art upon reading this disclosure.

Figure 5:
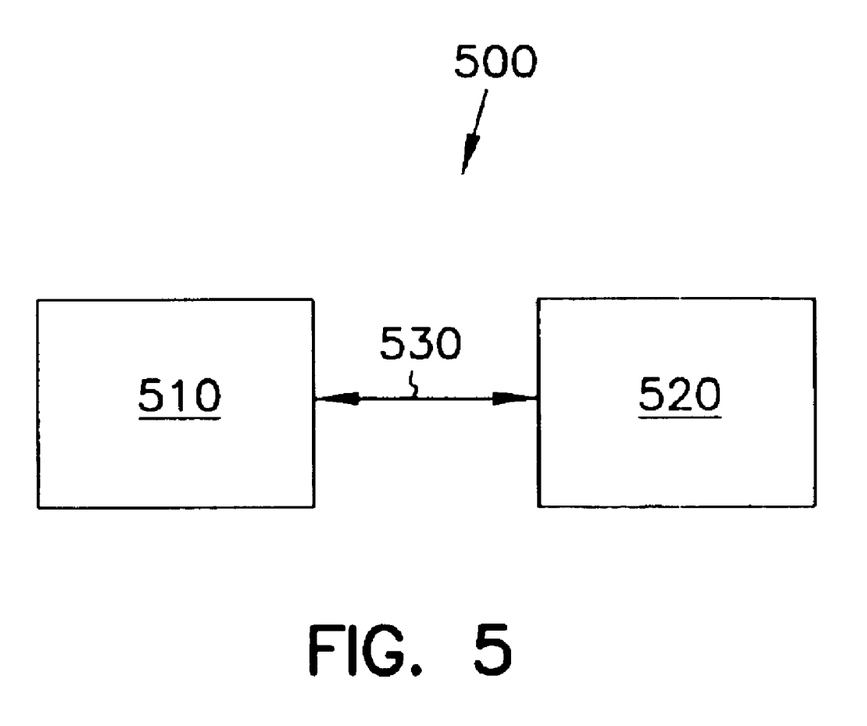
FIG. 5 is a block diagram illustrating an electronic system 500 according to the teachings of the present invention.

FIG. 5 is a block diagram illustrating an electronic system 500 according to the teachings of the present invention. The electronic system 500 includes a processor or processing unit 510 and a memory device 520, e.g. a random access memory (RAM). A bus 530 communicatively couples the processing unit 510 and the memory device 520. In one embodiment, the bus 530 includes a system bus, a serial connection, or other bus. In one embodiment, the processor unit 510 and the memory device 520 are on a single semiconductor wafer. In an alternative embodiment, the processor unit 510 and the memory device 520 are on two separate semiconductor wafers. The memory device 520 further includes a sense amplifier, latch circuit, amplifier circuit, or memory circuit, as described and presented in detail above in connection with FIGS. 2A, 3, and 4.

CONCLUSION

A structure and method for improving differential amplifier operation are provided. High performance, wide bandwidth or very fast CMOS amplifiers are possible using the new circuit topology of the present invention. The new modified sense amplifier for low voltage DRAMs is as much as 100 times faster than a conventional voltage sense amplifier when low power supply voltages, e.g. Vdd less than 1.0 Volts, are utilized. In the novel sense amplifier, the bit line capacitances are separated from the output nodes of the sense amplifier.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along the full scope of equivalents to which such claims are entitled.

What is claimed is:

1. A latch circuit, comprising:
 a pair of cross-coupled amplifiers, wherein each amplifier includes:
  a first transistor of a first conductivity type;
  a dual-gated metal-oxide semiconducting field effect transistor (MOSFET) of a second conductivity type, wherein a drain region for the dual-gated MOSFET is coupled to a drain region of the first transistor in the same amplifier, is coupled directly to a gate of the first transistor of the first conductivity type in the other amplifier in the pair of cross-coupled amplifiers, and is coupled to a gate of the dual-gated MOSFET in the other amplifier in the pair of cross-coupled amplifiers, the dual-gated MOSFET having a threshold voltage ranging from about 0.3 V to about 0.35V;
  a pair of input transmission lines, wherein each one of the pair of input transmission lines is coupled to another gate of the dual-gated MOSFET in each amplifier, the pair of input transmission lines directly coupling the another gate in each amplifier external to the latch circuit; and a pair of output transmission lines, wherein each one of the pair of output transmission lines is coupled to the drain region of the first transistor and to the drain region of the dual-gated MOSFET.

2. The latch circuit of claim 1, wherein the first transistor includes a p-channel metal oxide semiconductor (PMOS) transistor, and wherein the dual-gated MOSFET include n-channel metal oxide semiconductor (NMOS) transistors.

3. The latch circuit of claim 1, wherein the pair of input transmission lines are bit lines and wherein the bit line capacitances are removed from the pair of output transmission lines.

4. The latch circuit of claim 3, wherein each bit line is coupled to a number of memory cells in an array of memory cells.

5. The latch circuit of claim 1, wherein the latch circuit is coupled to a power supply voltage of less than 1.0 Volts.

6. A latch circuit, comprising:
a pair of cross-coupled amplifiers, wherein each amplifier includes:
a first transistor of a first conductivity type;
a dual-gated metal-oxide semiconducting field effect transistor (MOSFET) of a second conductivity type, wherein a drain region for the dual-gated MOSFET is coupled to a drain region of the first transistor in the same amplifier, is coupled directly to a gate of the first transistor of the first conductivity type in the other amplifier in the pair of cross-coupled amplifiers, and is coupled to a gate of the dual-gated MOSFET in the other amplifier in the pair of cross-coupled amplifiers;
a pair of input transmission lines, wherein each one of the pair of input transmission lines is coupled to another gate of the dual-gated MOSFET in each amplifier, the pair of input transmission lines directly coupling the another gate in each amplifier external to the latch circuit; and
a pair of output transmission lines, wherein each one of the pair of output transmission lines is coupled to the drain region of the first transistor and to the drain region of the dual-gated MOSFET, wherein the latch circuit is able to output a full output sense voltage in less than 10 nanoseconds (ns).

7. An amplifier circuit, comprising:
a pair of cross-coupled inverters, wherein each inverter includes:
a transistor of a first conductivity type;
a dual-gated metal-oxide semiconducting field effect transistor (MOSFET) of a second conductivity type, wherein the transistor of a first conductivity type in each inverter and the a dual-gated MOSFET are coupled at a drain region in the same inverter, and wherein the drain region in each inverter is further coupled directly to a gate of the transistor of the first conductivity type in the other inverter of the pair of cross-couple inverters, and is coupled to one gate of the dual-gated MOSFET in the other inverter of the pair of cross-couple inverters, the dual-gated MOSFET having a threshold voltage ranging from about 0.3 V to about 0.35V;
a pair of input transmission lines, wherein each one of the pair of input transmission lines is coupled to another gate of the dual-gated MOSFET in each inverter respectively, the pair of input transmission lines directly coupling the another gate in each amplifier external to the latch circuit; and
a pair of output transmission lines, wherein each one of the pair of output transmission lines is coupled to the drain region on each one of the pair of cross-coupled inverters.

8. The amplifier circuit of claim 7, wherein the transistor of a first conductivity type includes a p-channel metal oxide semiconductor (PMOS) transistor, and wherein the dual-gated MOSFET of a second conductivity type is divided into two separate n-channel metal oxide semiconductor (NMOS) transistors each driven by one of the dual gates.

9. The amplifier circuit of claim 7, wherein the pair of cross-coupled inverters comprise a sense amplifier, and wherein the sense amplifier is included in a memory circuit.

10. The amplifier circuit of claim 9, wherein the sense amplifier is coupled to a power supply voltage of less than 1.0 Volts.

11. An amplifier circuit, comprising:
a pair of cross-coupled inverters, wherein each inverter includes:
a transistor of a first conductivity type;
a dual-gated metal-oxide semiconducting field effect transistor (MOSFET) of a second conductivity type, wherein the transistor of a first conductivity type in each inverter and the a dual-gated MOSFET are coupled at a drain region in the same inverter, and wherein the drain region in each inverter is further coupled directly to a gate of the transistor of the first conductivity type in the other inverter of the pair of cross-couple inverters, and is coupled to one gate of the dual-gated MOSFET in the other inverter of the pair of cross-couple inverters;
a pair of input transmission lines, wherein each one of the pair of input transmission lines is coupled to another gate of the dual-gated MOSFET in each inverter respectively, the pair of input transmission lines directly coupling the another gate in each amplifier external to the latch circuit; and
a pair of output transmission lines, wherein each one of the pair of output transmission lines is coupled to the drain region on each one of the pair of cross-coupled inverters, wherein the sense amplifier is able to output a full output sense voltage in less than 10 nanoseconds (ns).

12. A memory circuit, comprising:
a number of memory arrays;
at lease one sense amplifier, wherein the sense amplifier includes:
a pair of cross-coupled inverters, wherein each inverter includes:
a p-channel metal oxide semiconductor (PMOS) transistor; and
a dual-gate metal oxide semiconductor (NMOS) transistor wherein a drain region of the PMOS transistor in each inverter is coupled to a drain region of for the dual-gate NMOS transistor in the same inverter, is coupled directly to a gate of the PMOS transistor in the other inverter of the pair of cross-couple inverters, and to one gate of the dual-gate NMOS transistor in the other inverter of the pair of cross-couple inverters, the dual-gated NMOS having a threshold voltage ranging from about 0.3 V to about 0.35V;
a complementary pair of bit lines coupling the at least one sense amplifier to a number of memory cells in the number of memory arrays, and wherein each one of the complementary pair of bit lines couples to another gate of the dual-gate NMOS transistor in each inverter, the complementary pair of bit lines directly coupling the another gate in each amplifier external to the sense amplifier; and a pair of output transmission lines, wherein each one of the pair of output transmission lines is coupled to the drain region of the PMOS transistor and the drain region for the dual-gate NMOS transistor in each inverter.

13. The memory circuit of claim 12, wherein the memory circuit includes a folded bit line memory circuit.

14. The memory circuit of claim 12, wherein the at least one sense amplifier is coupled to a power supply voltage of less than 1.0 Volts.

15. The memory circuit of claim 12, wherein the at least one sense amplifier is able to output a full output sense voltage in less than 10 nanoseconds (ns).

16. The memory circuit of claim 12, wherein the memory circuit further includes a number of equilibration and a number of isolation transistors coupled to the complementary pair of bit lines.

17. An electronic system, comprising:
a processor;
a memory device; and
a bus coupling the processor and the memory device, the memory device further including a sense amplifier, comprising:
    a pair of cross-coupled inverters, wherein each inverter includes:
        a p-channel metal oxide semiconductor (PMOS) transistor; and
        a dual-gate metal oxide semiconductor (NMOS) transistor having a threshold voltage ranging from about 0.3 V to about 0.35V, wherein a drain region of the PMOS transistor in each inverter is coupled to a drain region for the dual-gate NMOS transistor in the same inverter, is coupled directly to a gate of the PMOS transistor in the other inverter of the pair of cross-couple inverters, and is coupled to one gate of the dual-gate NMOS transistor in the other inverter of the pair of cross-couple inverters;
    a complementary pair of bit lines coupling the at least one sense amplifier to a number of memory cells in a memory cell array, and wherein each one of the complementary pair of bit lines couples to another gate of the dual-gate NMOS transistor in each inverter, the complementary pair of bit lines directly coupling the another gate in each amplifier external to the sense amplifier; and
    a pair of output transmission lines, wherein each one of the pair of output transmission lines is coupled to the drain region of the PMOS transistor and the drain region for the dual-gate NMOS transistor in each inverter.

18. The electronic system of claim 17, wherein the sense amplifier is coupled to a power supply voltage of less than 1.0 Volt.

19. An electronic system, comprising:
a processor;
a memory device; and
a bus coupling the processor and the memory device, the memory device further including a sense amplifier, comprising:
    a pair of cross-coupled inverters, wherein each inverter includes:
        a p-channel metal oxide semiconductor (PMOS) transistor; and
        a dual-gate metal oxide semiconductor (NMOS) transistor wherein a drain region of the PMOS transistor in each inverter is coupled to a drain region for the dual-gate NMOS transistor in the same inverter, is coupled directly to a gate of the PMOS transistor in the other inverter of the pair of cross-couple inverters, and is coupled to one gate of the dual-gate NMOS transistor in the other inverter of the pair of cross-couple inverters;
    a complementary pair of bit lines coupling the at least one sense amplifier to a number of memory cells in a memory cell array, and wherein each one of the complementary pair of bit lines couples to another gate of the dual-gate NMOS transistor in each inverter, the complementary pair of bit lines directly coupling the another gate in each amplifier external to the sense amplifier; and
    a pair of output transmission lines, wherein each one of the pair of output transmission lines is coupled to the drain region of the PMOS transistor and the drain region for the dual-gate NMOS transistor in each inverter, wherein the sense amplifier is able to output a full output sense voltage in less than 10 nanoseconds (ns).

20. An integrated circuit, comprising:
a processor;
a memory operatively coupled to the processor; and
wherein the processor and memory are formed on the same semiconductor substrate and the integrated circuit includes at least one sense amplifier, comprising:
    a pair of cross-coupled inverters, wherein each inverter includes:
        a transistor of a first conductivity type;
        a dual-gate transistor of a second conductivity type wherein a drain region for the dual-gate transistor in each inverter is coupled to a drain region of the transistor of the first conductivity type in the same inverter, is coupled directly to a gate of the transistor of the first conductivity type in the other inverter of the pair of cross-couple inverters, and to one gate of the dual-gate transistor in the other inverter of the pair of cross-couple inverters, the dual-gated transistor having a threshold voltage ranging from about 0.3 V to about 0.35V;
    a pair of bit lines, wherein each one of the pair of bit lines is coupled to another gate of the dual-gate transistors in each inverter, the pair of bit lines directly coupling the another gate of the dual-gate transistors in each inverter external to the sense amplifier; and
    a pair of output transmission lines, wherein each one of the pair of output transmission lines is coupled to the drain region of the dual-gate transistor and the drain region of the transistor of the first conductivity type in each inverter.

21. A method for forming a current sense amplifier, comprising:
cross coupling a pair of inverters, wherein each inverter includes:
    a transistor of a first conductivity type;
    a dual-gate transistor of a second conductivity type wherein a drain region for the dual-gate transistor is coupled to a drain region of the transistor of the first conductivity type, the dual-gated MOSFET having a threshold voltage ranging from about 0.3 V to about 0.35V; and
coupling external to the sense amplifier one gate of each dual-gate transistor of each inverter, wherein cross coupling the pair of inverters includes directly coupling the drain region for the transistor of the first conductivity type and the drain region for the dual-gate transistor in one inverter to a gate of the transistor of a first conductivity type and to one gate of the dual-gate transistor in the other inverter.

22. The method of claim 21, wherein cross coupling the pair of inverters includes forming the first transistor of the first conductivity type as a p-channel metal oxide semiconductor (PMOS) transistor, and forming the dual-gate transistor of a second conductivity type as an n-channel metal oxide semiconductor (NMOS) transistor.

23. The method of claim 21, wherein the method further includes coupling a bit line to another gate of the dual-gate transistor in each inverter.

24. The method of claim 21, wherein the method further includes coupling an output transmission line to the drain region for the dual-gate transistor and the drain region of the transistor of the first conductivity type in each inverter.

25. A method for forming a sense amplifier, comprising:
forming and cross coupling a pair of inverters, wherein forming and cross coupling each inverter includes:
forming a first transistor of a first conductivity type;
forming a dual-gate transistor of a second conductivity type, wherein forming the dual-gate transistor includes coupling the drain region for the dual-gate transistor to a drain region of the first transistor in each inverter, directly coupling the drain region for the dual-gate transistor in each inverter to a gate of the first transistor of the first conductivity type in the other inverter and to a gate of the dual-gate transistor of the second conductivity type in the other inverter, the dual-gated transistor having a threshold voltage ranging from about 0.3 V to about 0.35V;
coupling a bit line to another gate of the dual-gate transistor in each inverter, each bit line directly coupling the another gate of the dual-gate transistors in each inverter external to the sense amplifier; and
coupling an output transmission line to the drain region of the first transistor and to the drain region of the dual-gate transistor in each inverter.

26. The method of claim 25, wherein forming the first transistor of a first conductivity type includes forming a p-channel metal oxide semiconductor (PMOS) transistor, and wherein forming the dual-gate transistor of a second conductivity type includes forming an n-channel metal oxide semiconductor (NMOS) transistor.

27. A method for operating a sense amplifier, comprising:
equilibrating a first and second bit line, wherein the first bit line is coupled to a first gate of a dual-gate transistor in a first inverter in the sense amplifier and the second bit lines is coupled to a first gate of a dual-gate transistor in a second inverter in the sense amplifier, the first bit line directly coupling the first gate of the dual-gate transistor in the first inverter external to the sense amplifier and the second bit line directly coupling the first gate of the dual-gate transistor in the second inverter external to the sense amplifier, the dual-gated transistor having a threshold voltage ranging from about 0.3 V to about 0.35V to operate in a sub-threshold or threshold region during most of switching transients of the dual-gated transistor;

discharging a memory cell onto the first bit line, wherein discharging a memory cell onto the first bit line drives a signal from a drain region for the first inverter directly to a gate of a PMOS transistor and to a second gate of a dual-gate transistor in the second inverter; and providing a feedback from a drain region for the second inverter to a gate of a PMOS transistor and a second gate of a dual-gate transistor in the first inverter.

28. The method of claim 27, wherein operating the sense amplifier includes operating the sense amplifier with a power supply voltage of less that 1.0 Volts.

29. The method of claim 27, wherein operating the sense amplifier includes latching an output sense signal in less than 10 nanoseconds (ns).

30. The method of claim 27, wherein the method further includes removing the bit line capacitance from a pair of output nodes of the sense amplifier.

31. A method for operating a sense amplifier, comprising:
providing a first bit line signal directly from the external of the sense amplifier to a first gate of a dual-gate transistor in a first inverter of the sense amplifier, the dual-gated transistor having a threshold voltage ranging from about 0.3 V to about 0.35V to operate in a sub-threshold or threshold region during most of switching transients of the dual-gated transistor;
providing a second bit line signal directly from the external of the sense amplifier to a first gate of a dual-gate transistor in a second inverter of the sense amplifier
wherein providing the first and the second bit line signals to the first gates of the dual-gate transistors drives a signal directly from a drain region for the first inverter to a gate of a PMOS transistor and to a second gate of a dual-gate transistor in the second inverter; and
wherein providing the first and the second bit line signals to the first gates of the dual-gate transistors isolates the bit line capacitances from a first and second output node on the sense amplifier.

32. A method for operating a sense amplifier, comprising:
providing an input signal from a bit line directly from the external of the sense amplifier to a first gate of a dual-gate transistor in a first inverter of the sense amplifier, the dual-gated transistor having a threshold voltage ranging from about 0.3 V to about 0.35V to operate in a sub-threshold or threshold region during most of switching transients of the dual-gated transistor;
wherein providing the input signal from the bit line to the first gate of the dual-gate transistor in the first inverter of the sense amplifier drives a signal directly from a drain region for the first inverter to a gate of a PMOS transistor and to a gate of a dual-gate transistor in a second inverter; and
wherein providing the input signal to the first gate of the dual-gate transistor isolates the bit line capacitance from an output node on the sense amplifier.

* * * * *

UNITED STATES PATENT AND TRADEMARK OFFICE
CERTIFICATE OF CORRECTION

PATENT NO. : 6,741,104 B2
DATED : May 25, 2004
INVENTOR(S) : Forbes et al.

It is certified that error appears in the above-identified patent and that said Letters Patent is hereby corrected as shown below:

Column 4,
Line 54, delete "12" and insert -- I2 --, therefor.

Column 5,
Line 31, delete -- $\sqrt{V_{Iout}/\Delta V}$ -- and insert -- $\sqrt{V_{out}/\Delta V}$ --, therefor.

Column 10,
Line 43, after "along" insert -- with --.

Column 11,
Line 49, after "the" delete "a".

Column 12,
Line 20, after "the" delete "a".
Line 51, after "of" delete "for"

Column 16,
Line 12, delete "that" and insert -- than --, therefor.

Signed and Sealed this

Sixteenth Day of November, 2004

JON W. DUDAS
*Director of the United States Patent and Trademark Office*